US012227841B2

(12) United States Patent
Ishizaka

(10) Patent No.: US 12,227,841 B2
(45) Date of Patent: Feb. 18, 2025

(54) RUTHENIUM FILM FORMING METHOD AND SUBSTRATE PROCESSING SYSTEM

(71) Applicant: TOKYO ELECTRON LIMITED, Tokyo (JP)

(72) Inventor: Tadahiro Ishizaka, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/125,236

(22) Filed: Mar. 23, 2023

(65) Prior Publication Data

US 2023/0227973 A1 Jul. 20, 2023

Related U.S. Application Data

(62) Division of application No. 16/922,784, filed on Jul. 7, 2020, now Pat. No. 11,680,320.

(30) Foreign Application Priority Data

Jul. 11, 2019 (JP) .................. 2019-129545

(51) Int. Cl.
*H01L 21/67* (2006.01)
*C23C 16/02* (2006.01)
*C23C 16/06* (2006.01)
*C23C 16/16* (2006.01)
*C23C 16/455* (2006.01)
(Continued)

(52) U.S. Cl.
CPC .... *C23C 16/45536* (2013.01); *C23C 16/0272* (2013.01); *C23C 16/06* (2013.01); *C23C 16/16* (2013.01); *H01L 21/285* (2013.01); *H01L 21/28568* (2013.01); *H01L 21/3205* (2013.01);
(Continued)

(58) Field of Classification Search
CPC .......... C23C 16/45536; C23C 16/0272; C23C 16/06; C23C 16/16; C23C 14/02; C23C 16/045; C23C 16/45523; C23C 16/0227; C23C 16/54; H01L 21/285; H01L 21/28568; H01L 21/3205; H01L 21/67017; H01L 21/76877; H01L 23/53242; H01L 21/28556; H01L 21/76814; H01L 21/76826; H01L 21/76879; H01L 21/67207
See application file for complete search history.

(56) References Cited

U.S. PATENT DOCUMENTS 10,002,834 B2 * 6/2018 Naik ................ H01L 21/76846
10,763,108 B2 * 9/2020 Hausmann ........ H01L 21/02186
(Continued)

FOREIGN PATENT DOCUMENTS

CN 101325176 A * 12/2008 ......... C23C 16/0281
JP H11-016859 A 1/1999
(Continued)

*Primary Examiner* — Mohammed Shamsuzzaman
(74) *Attorney, Agent, or Firm* — Nath, Goldberg & Meyer; Jerald L. Meyer; Tanya E. Harkins

(57) ABSTRACT

A ruthenium film forming method includes: causing chlorine to be adsorbed to an upper portion of a recess at a higher density than to a lower portion of the recess by supplying a chlorine-containing gas to a substrate including an insulating film and having the recess; and forming a ruthenium film in the recess by supplying a Ru-containing precursor to the recess to which the chlorine is adsorbed.

8 Claims, 12 Drawing Sheets

(51) Int. Cl.
*H01L 21/285* (2006.01)
*H01L 21/3205* (2006.01)
*H01L 21/768* (2006.01)

(52) U.S. Cl.
CPC .. *H01L 21/67017* (2013.01); *H01L 21/76877* (2013.01)

(56) References Cited

U.S. PATENT DOCUMENTS

| | | | |
|---|---|---|---|
| 11,133,180 B2 * | 9/2021 | Kang | H01L 21/02219 |
| 11,152,260 B2 * | 10/2021 | Ishizaka | H01L 21/67017 |
| 11,227,794 B2 * | 1/2022 | Wang | H01L 21/76883 |
| 11,387,112 B2 * | 7/2022 | Takatsuki | C23C 16/045 |
| 2005/0070109 A1 * | 3/2005 | Feller | C09K 3/1463 |
| | | | 438/692 |
| 2011/0177493 A1 * | 7/2011 | Lu | B01J 23/75 |
| | | | 977/751 |
| 2016/0079072 A1 * | 3/2016 | Wang | H01L 21/3065 |
| | | | 438/719 |
| 2016/0268207 A1 * | 9/2016 | Naik | H01L 23/53238 |
| 2017/0221718 A1 * | 8/2017 | Tapily | H01L 21/02178 |
| 2018/0254181 A1 * | 9/2018 | Ishizaka | H01L 21/76883 |
| 2018/0347041 A1 * | 12/2018 | Kim | C23C 16/45534 |
| 2019/0164825 A1 * | 5/2019 | Yang | H01L 21/67103 |
| 2019/0348369 A1 * | 11/2019 | Naik | H01L 23/53209 |
| 2020/0066585 A1 * | 2/2020 | Lin | H01L 21/76879 |
| 2020/0090991 A1 * | 3/2020 | Yu | H01L 21/76847 |
| 2020/0118824 A1 * | 4/2020 | Okada | H01L 21/76879 |
| 2020/0135574 A1 * | 4/2020 | Yang | H01L 29/0649 |
| 2020/0303250 A1 * | 9/2020 | Cen | H01L 21/76814 |
| 2020/0343136 A1 * | 10/2020 | Yu | H01L 21/0228 |
| 2022/0301882 A1 * | 9/2022 | Takatsuki | C23C 16/54 |

FOREIGN PATENT DOCUMENTS

| | | |
|---|---|---|
| JP | 2010-278468 A | 12/2010 |
| JP | 2017-050304 A | 3/2017 |
| JP | 2017-092101 A | 5/2017 |
| JP | 2018-14477 A | 1/2018 |
| JP | 2018-137369 A | 8/2018 |
| JP | 2018-170409 A | 11/2018 |
| KR | 10-2006-0134821 A | 12/2006 |
| KR | 10-2018-0097154 A | 8/2018 |
| KR | 10-2018-0101226 A | 9/2018 |

* cited by examiner

US 12,227,841 B2

RUTHENIUM FILM FORMING METHOD AND SUBSTRATE PROCESSING SYSTEM

CROSS-REFERENCE TO RELATED APPLICATION(S)

This is a Divisional Application of U.S. patent application Ser. No. 16/922,784, filed Jul. 7, 2020, an application claiming benefit from Japanese Application No. 2019-129545, filed Jul. 11, 2019, the content of each of which is hereby incorporated by reference in its entirety.

TECHNICAL FIELD

The present disclosure relates to a ruthenium film forming method and a substrate processing system.

BACKGROUND

There is known a technique of embedding a ruthenium film in a recess such as a trench or the like provided in an insulating layer (see, e.g., Patent Document 1).

PRIOR ART DOCUMENT

Patent Document

Patent Document 1: Japanese laid-open publication No. 2018-14477

SUMMARY

According to an aspect of the present disclosure, there is provided a ruthenium film forming method including: causing chlorine to be adsorbed to an upper portion of a recess at a higher density than to a lower portion of the recess by supplying a chlorine-containing gas to a substrate including an insulating film and having the recess; and forming a ruthenium film in the recess by supplying a Ru-containing precursor to the recess to which the chlorine is adsorbed.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1A:
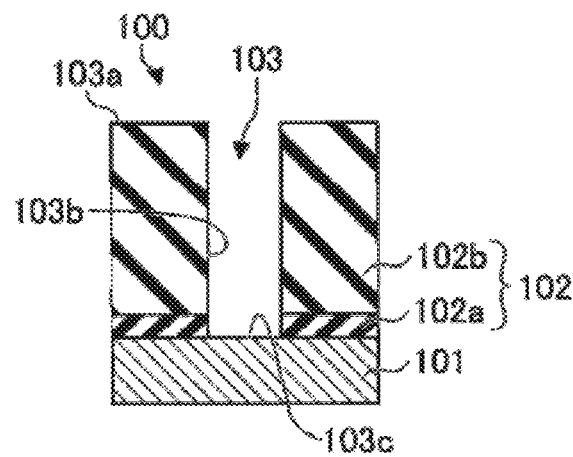
FIGS. 1A to 1F are sectional process views showing an example of a ruthenium film forming method according to one embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, a non-limiting exemplary embodiment of the present disclosure will be described with reference to the accompanying drawings. Throughout the accompanying drawings, the same or corresponding members or parts will be denoted by the same or corresponding reference numerals, and the redundant description thereof will be omitted.

[Ruthenium Film Forming Method]

An example of a method for forming a ruthenium (Ru) film according to one embodiment will be described. FIGS. 1A to 1F are sectional process views showing an example of a ruthenium film forming method according to one embodiment.

The ruthenium film forming method shown in FIGS. 1A to 1F includes a step of causing chlorine to be adsorbed to an upper portion of a recess at a higher density than to a lower portion of the recess by supplying a chlorine-containing gas to a substrate including an insulating film and having the recess, and a step of forming a ruthenium film in the recess by supplying a Ru-containing precursor to the recess to which the chlorine is adsorbed. The details will be described below.

First, as shown in FIG. 1A, a substrate 100 having an insulating film 102 formed on a metal layer 101 is prepared. The substrate 100 is, for example, a semiconductor wafer such as a silicon wafer or the like. The metal layer 101 is, for example, a wiring material such as a tungsten film or the like. The insulating film 102 is, for example, a laminated film of a silicon nitride film 102a and a silicon oxide film 102b. The silicon nitride film 102a is, for example, an etching stopper layer. The silicon oxide film 102b is, for example, an interlayer insulating film. The insulating film 102 may be a single layer film such as a silicon nitride film or a silicon oxide film. A recess 103 such as a trench or a hole is formed in the insulating film 102. The metal layer 101 is exposed on a bottom surface 103c of the recess 103. When a natural oxide film or the like is formed on the exposed surface of the metal layer 101, a cleaning step of removing the natural oxide film or the like may be performed. The cleaning step is, for example, a step of removing the oxide film formed on the bottom surface 103c of the recess 103 (the exposed surface of the metal layer 101) by supplying a chlorine-containing gas to the bottom surface 103c of the recess 103. For example, a tungsten oxide film may be removed by alternately supplying a chlorine ($Cl_2$) gas and plasma using an argon (Ar) gas. When the processing temperature is high (e.g., 200 degrees C. or higher), the tungsten oxide film may be removed by supplying only the $Cl_2$ gas without using the plasma of the Ar gas. In addition, the tungsten oxide film may be physically removed by performing sputtering with the plasma of the Ar gas.

Figure 1B:
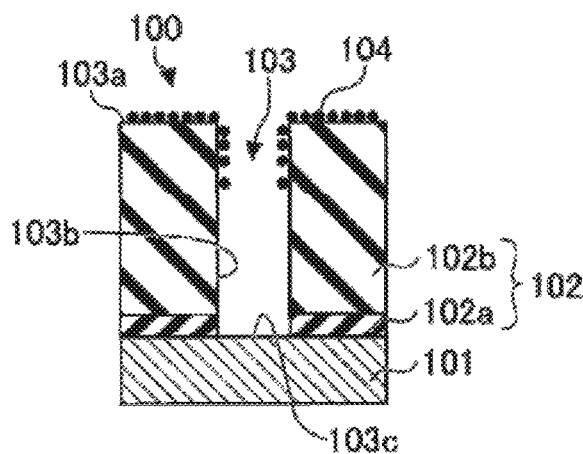

Subsequently, as shown in FIG. 1B, a chlorine-containing gas is supplied to the substrate 100 so that chlorine 104 is adsorbed to the upper portion of the recess 103 at a higher density than to the lower portion of the recess 103. For example, the chlorine 104 is adsorbed to an upper surface 103a and the upper portion of a side surface 103b of the recess 103. The chlorine 104 is not adsorbed to the lower portion of the side surface 103b and the bottom surface 103c of the recess 103. The method of causing the chlorine 104 to be adsorbed to the upper portion of the recess 103 at a higher density than to the lower portion of the recess 103 is not particularly limited, and may be, for example, a method of supplying a chlorine-containing gas into a depressurized processing container by activating the chlorine-containing gas with plasma. Furthermore, the method may be, for example, a method of adjusting a process condition such as a pressure, a temperature, a gas flow rate, and the like in a processing container without activating a chlorine-containing gas with plasma. The chlorine-containing gas is, for example, a $Cl_2$ gas.

Figure 1C:
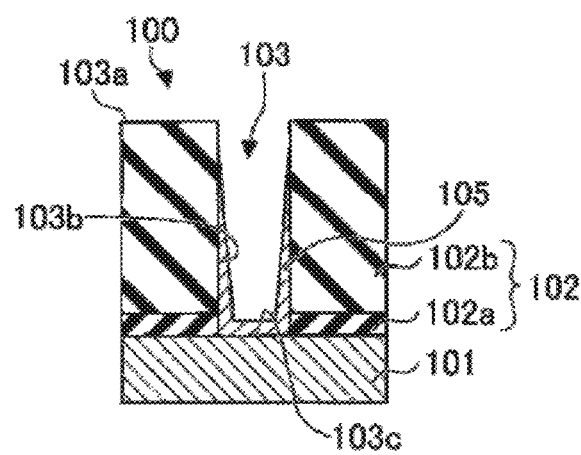

Subsequently, as shown in FIG. 1C, a ruthenium film 105 is formed in the recess 103 by supplying a Ru-containing precursor to the recess 103 to which the chlorine 104 is adsorbed. At this time, the chlorine 104 serves as an adsorption inhibition layer that inhibits adsorption of the Ru-containing precursor. Therefore, the ruthenium film 105 is hard to be formed on the surface of the recess 103 to which the chlorine 104 is adsorbed. For that reason, at the initial stage of film formation, the ruthenium film 105 is thickly formed on the lower portion of the side surface 103b and the bottom surface 103c of the recess 103 to which the chlorine 104 is not adsorbed. On the other hand, the ruthenium film 105 is scarcely formed on the upper surface 103a and the upper portion of the side surface 103b of the recess 103 to which the chlorine 104 is adsorbed, or is formed more thinly on the upper surface 103a and the upper portion of the side surface 103b of the recess 103 than on the lower portion of the side surface 103b and the bottom surface 103c of the recess 103. As a result, the ruthenium film 105 is formed in a V shape in the recess 103. The Ru-containing precursor is, for example, triruthenium dodecacarbonyl ($Ru_3(CO)_{12}$), $\eta^4$-2,3-dimethylbutadiene ruthenium tricarbonyl (Ru(DMBD)(CO)$_3$), (2,4-dimethylpentadienyl)(ethylcyclopentadienyl) ruthenium (Ru(DMPD)(EtCp)), bis(2,4-dimethylpentadienyl) ruthenium (Ru(DMPD)$_2$), 4-dimethylpentadienyl (methylcyclopentadienyl) ruthenium (Ru(DMPD)(MeCp), bis (cyclopentadienyl) ruthenium (Ru($C_5H_5$)$_2$), cis-dicarbonyl bis (5-methylhexane-2,4-dionate) ruthenium (II), or the like.

Figure 1D:
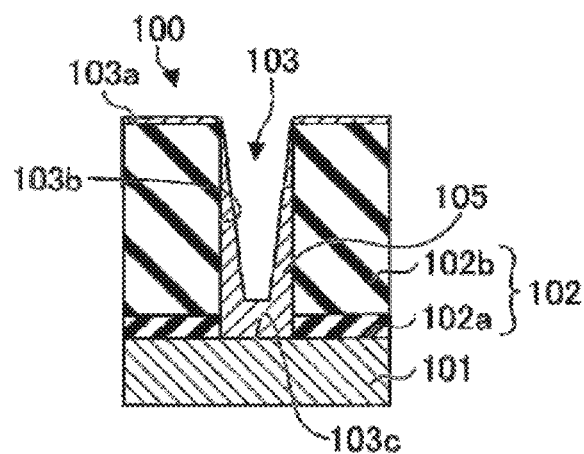
Figure 1E:
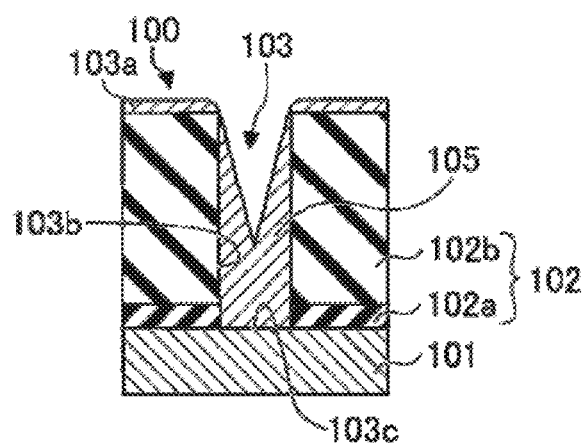
Figure 1F:
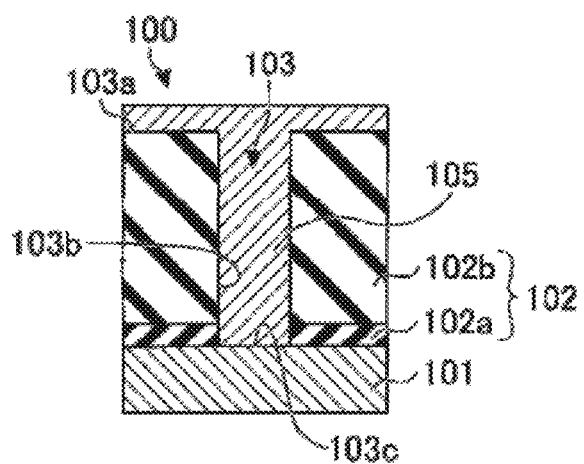

Subsequently, as shown in FIGS. 1D and 1E, the ruthenium film 105 is embedded in the recess 103 by continuously supplying the Ru-containing precursor to the recess 103. At this time, since the ruthenium film 105 is formed in a V shape in the recess 103 at the initial stage of film formation, bottom-up film formation is performed in which film formation gradually progresses upward from the bottom surface 103c of the recess 103. As a result, as shown in FIG. 1F, the ruthenium film 105 in which generation of voids, seams, and the like is suppressed can be formed in the recess 103. That is to say, the ruthenium film 105 having good embedding characteristics can be formed in the recess 103.

Another example of the ruthenium film forming method according to one embodiment will be described. FIGS. 2A to 2I are sectional process views showing another example of the ruthenium film forming method according to one embodiment.

The ruthenium film forming method shown in FIGS. 2A to 2I is a method of forming a ruthenium film in a recess by alternately repeating the step of causing the chlorine to be adsorbed and the step of forming the ruthenium film, which are adopted in the ruthenium film forming method shown in FIGS. 1A to 1F. The details will be described below.

Figure 2A:
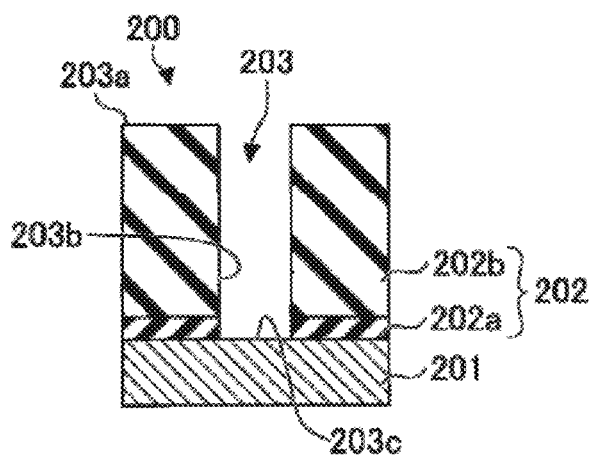
FIGS. 2A to 2I are sectional process views showing another example of the ruthenium film forming method according to one embodiment.

First, as shown in FIG. 2A, a substrate 200 having an insulating film 202 formed on a metal layer 201 is prepared. The substrate 200 is, for example, a semiconductor wafer such as a silicon wafer or the like. The metal layer 201 is, for example, a wiring material such as a tungsten film. The insulating film 202 is, for example, a laminated film of a silicon nitride film 202a and a silicon oxide film 202b. The silicon nitride film 202a is, for example, an etching stopper layer. The silicon oxide film 202b is, for example, an interlayer insulating film. The insulating film 202 may be, for example, a single layer film such as a silicon nitride film or a silicon oxide film. A recess 203 such as a trench or a hole is formed in the insulating film 202. The metal layer 201 is exposed at a bottom surface 203c of the recess 203. When a natural oxide film or the like is formed on the exposed surface of the metal layer 201, a cleaning step of removing the natural oxide film or the like may be performed. The cleaning step is, for example, a step of supplying a chlorine-containing gas to the bottom surface 203c of the recess 203 to remove the oxide film formed on the bottom surface 203c of the recess 203 (the exposed surface of the metal layer 201). For example, a tungsten oxide film may be removed by alternately supplying a $Cl_2$ gas and plasma of an Ar gas. When the processing temperature is high (e.g., 200 degrees C. or higher), the tungsten oxide film may be removed by supplying only the $Cl_2$ gas without using the plasma of the Ar gas. In addition, the tungsten oxide film may be physically removed by performing sputtering with the plasma of the Ar gas.

Figure 2B:
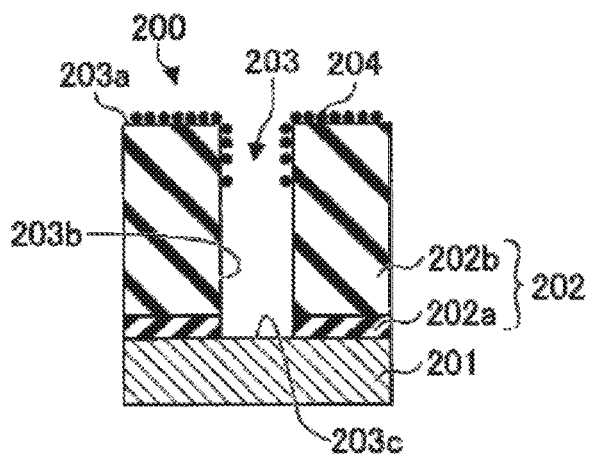

Subsequently, as shown in FIG. 2B, a chlorine-containing gas is supplied to the substrate 200 so that chlorine 204 is adsorbed to the upper portion of the recess 203 at a higher density than to the lower portion of the recess 203. For example, the chlorine 204 is adsorbed to an upper surface 203a and the upper portion of a side surface 203b of the recess 203, and the chlorine 204 is not adsorbed to the lower portion of the side surface 203b and the bottom surface 203c of the recess 203. The method of causing the chlorine 204 to be adsorbed to the upper portion of the recess 103 at a higher density than to the lower portion of the recess 203 is not particularly limited, and may be, for example, a method of supplying a chlorine-containing gas into a depressurized processing container by activating the chlorine-containing gas with plasma. Furthermore, the method may be, for example, a method of adjusting a process condition such as a pressure, a temperature, a gas flow rate, and the like in a processing container without activating a chlorine-containing gas with plasma. The chlorine-containing gas is, for example, a $Cl_2$ gas.

Figure 2C:
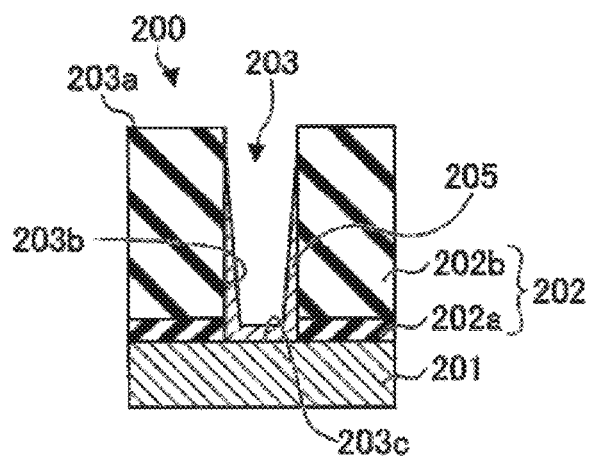

Subsequently, as shown in FIG. 2C, a ruthenium film 205 is formed in the recess 203 by supplying a Ru-containing precursor to the recess 203 to which the chlorine 204 is adsorbed. At this time, the chlorine 204 serves as an adsorption inhibition layer that inhibits adsorption of the Ru-containing precursor. Therefore, it is hard for the ruthenium film 205 to be formed on the surface of the recess 203 to which the chlorine 104 is adsorbed. For that reason, at the initial stage of film formation, the ruthenium film 205 is thickly formed on the lower portion of the side surface 203b and the bottom surface 203c of the recess 203 to which the chlorine 204 is not adsorbed. On the other hand, the ruthenium film 205 is scarcely formed on the upper surface 203a and the upper portion of the side surface 203b of the recess 203 to which the chlorine 204 is adsorbed, or is formed more thinly on the upper surface 203a and the upper portion of the side surface 203b of the recess 203 than on the lower portion of the side surface 203b and the bottom surface 203c of the recess 203. As a result, the ruthenium film 205 is formed in a V shape in the recess 203. The Ru-containing precursor may be, for example, the same as the Ru-containing precursor used in the ruthenium film forming method shown in FIGS. 1A to 1F described above.

Figure 2D:
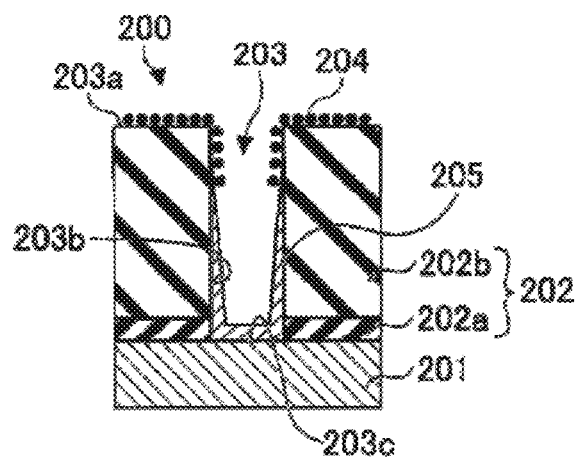

Subsequently, as shown in FIG. 2D, a chlorine-containing gas is supplied to the substrate 200 so that chlorine 204 is adsorbed to the upper portion of the recess 203 at a higher density than to the lower portion of the recess 203. For example, the chlorine 204 is adsorbed to the upper surface 203a and the upper portion of the side surface 203b of the recess 203, and the chlorine 204 is not adsorbed to the lower portion of the side surface 203b and the bottom surface 203c of the recess 203. The method of causing the chlorine 204 to be adsorbed to the upper portion of the recess 103 at a higher density than to the lower portion of the recess 203 is not particularly limited, and may be, for example, a method of supplying a chlorine-containing gas into a depressurized processing container by activating the chlorine-containing gas with plasma. Furthermore, the method may be, for example, a method of adjusting a process condition such as a pressure, a temperature, a gas flow rate, and the like in a processing container without activating a chlorine-containing gas with plasma. The chlorine-containing gas is, for example, a $Cl_2$ gas.

Figure 2E:
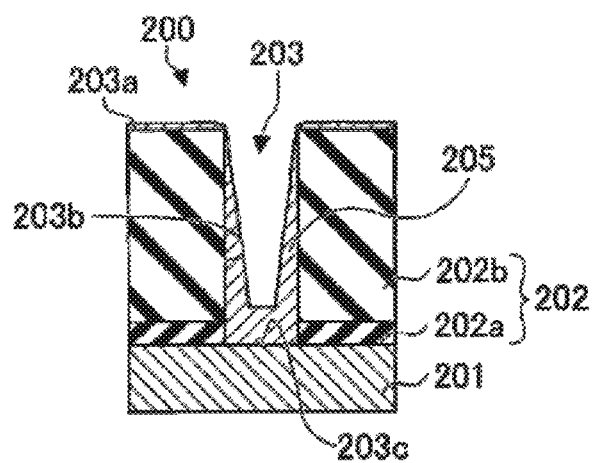
Figure 2F:
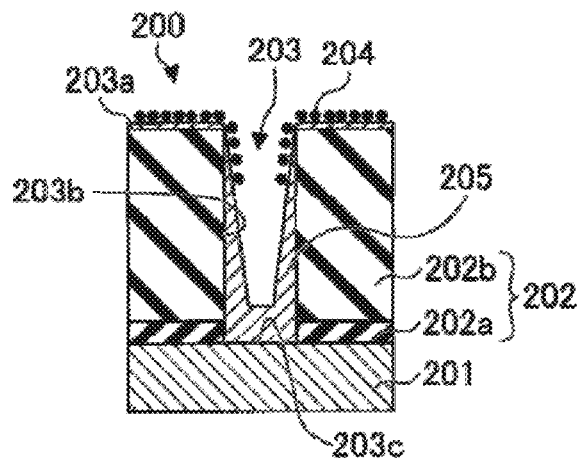
Figure 2G:
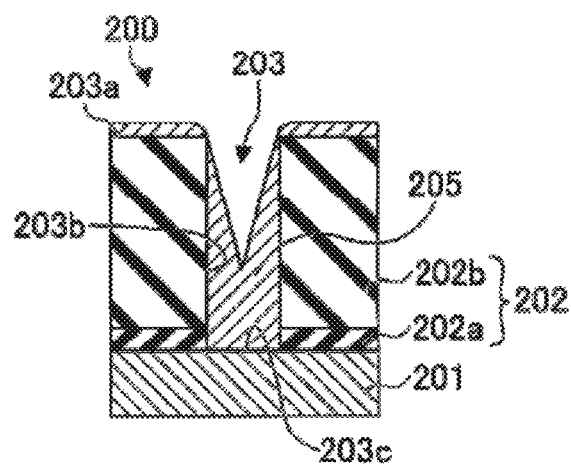
Figure 2H:
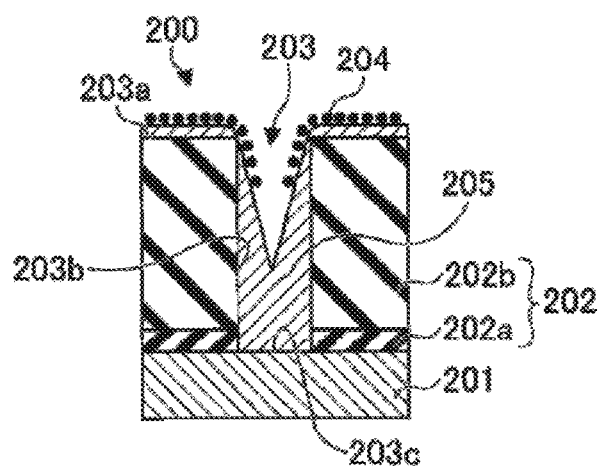
Figure 2I:
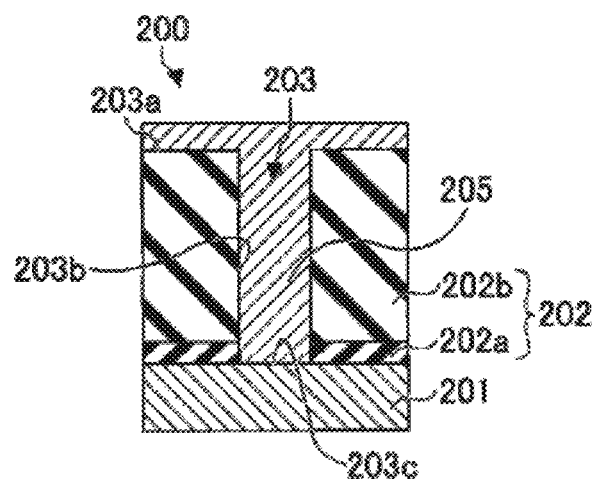

Subsequently, as shown in FIG. 2E, a ruthenium film 205 is formed in the recess 203 by supplying a Ru-containing precursor to the recess 203 to which the chlorine 204 is adsorbed. At this time, the chlorine 204 serves as an adsorption inhibition layer that inhibits adsorption of the Ru-containing precursor. Therefore, it is hard for the ruthenium film 205 to be formed on the surface of the recess 203 to which the chlorine 104 is adsorbed. For that reason, a ruthenium film 205 is thickly formed on the surface of the ruthenium film 205 formed on the lower portion of the side surface 203b and the bottom surface 203c of the recess 203 to which the chlorine 204 is not adsorbed. On the other hand, the ruthenium film 205 is scarcely formed on the upper surface 203a and the upper portion of the side surface 203b of the recess 203 to which the chlorine 204 is adsorbed, or is formed more thinly on the upper surface 203a and the upper portion of the side surface 203b of the recess 203 than on the surface of the ruthenium film 205 formed on the lower portion of the side surface 203b and the bottom surface 203c of the recess 203. As a result, the ruthenium film 205 is formed in a V shape in the recess 203. The Ru-containing precursor may be, for example, the same as the Ru-containing precursor used in the ruthenium film forming method shown in FIGS. 1A to 1F described above.

Subsequently, as shown in FIGS. 2F to 2I, the adsorption of the chlorine 204 and the formation of the ruthenium film 205 are alternately repeated to embed the ruthenium film 205 in the recess 203. At this time, since the ruthenium film 205 is embedded in the recess 203 by alternately repeating the adsorption of the chlorine and the formation of the ruthenium film 205, the bottom-up film formation in which film formation gradually progresses upward from the bottom surface 203c of the recess 203 is promoted. As a result, even when the recess 203 has a high aspect ratio (ratio of the depth to the opening width of the recess 203), it is possible to form the ruthenium film 205 in which generation of voids, seams and the like is suppressed. That is, the ruthenium film 205 having good embedding characteristics can be formed in the recess 203 having a high aspect ratio.

[Substrate Processing System]

Figure 3:
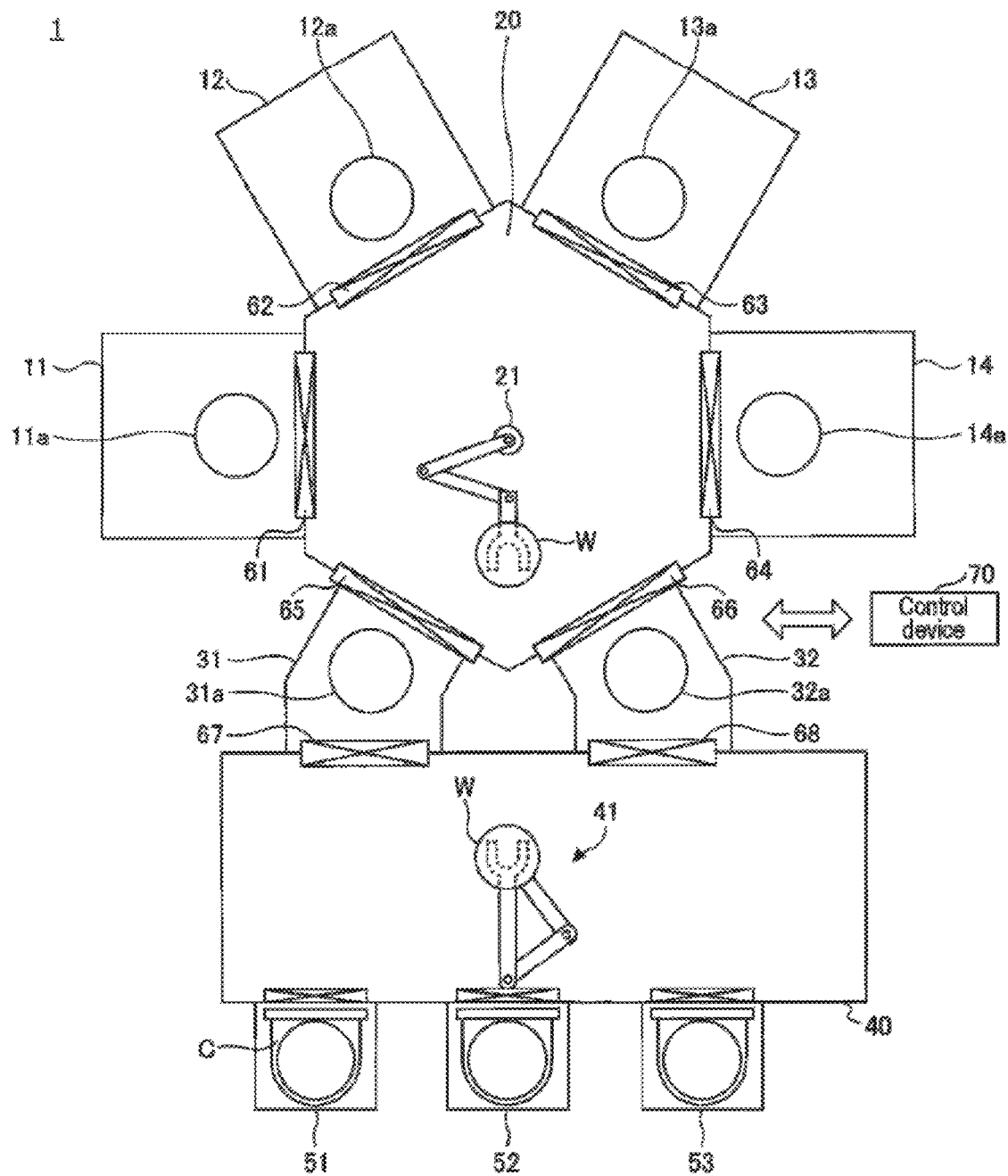
FIG. 3 is a schematic diagram showing an example of a configuration of a substrate processing system.

An example of a substrate processing system that realizes the ruthenium film forming method according to one embodiment will be described. FIG. 3 is a schematic diagram showing a configuration example of the substrate processing system.

A substrate processing system 1 includes processing chambers 11 to 14, a vacuum transfer chamber 20, load lock chambers 31 and 32, an atmospheric transfer chamber 40, load ports 51 to 53, gate valves 61 to 68, and a control device 70.

The processing chamber 11 includes a stage 11a on which a semiconductor wafer (hereinafter referred to as "wafer W") is mounted, and is connected to the vacuum transfer chamber 20 via the gate valve 61. Similarly, the processing chamber 12 includes a stage 12a on which the wafer W is mounted, and is connected to the vacuum transfer chamber 20 via the gate valve 62. The processing chamber 13 includes a stage 13a on which the wafer W is mounted, and is connected to the vacuum transfer chamber 20 via the gate valve 63. The processing chamber 14 includes a stage 14a on which the wafer W is mounted, and is connected to the vacuum transfer chamber 20 via the gate valve 64. The interiors of the processing chambers 11 to 14 are depressurized to a predetermined vacuum atmosphere, and the wafer W is subjected to desired processes (an etching process, a film-forming process, a cleaning process, an ashing process, and the like) inside the processing chambers 11 to 14. Operations of the respective components for performing processes in the processing chambers 11 to 14 are controlled by the control device 70.

The interior of the vacuum transfer chamber 20 is depressurized to a predetermined vacuum atmosphere. A transfer mechanism 21 is provided in the vacuum transfer chamber 20. The transfer mechanism 21 transfers the wafer W to and from the processing chambers 11 to 14 and the load lock chambers 31 and 32. Operation of the transfer mechanism 21 is controlled by the control device 70.

The load lock chamber 31 includes a stage 31a on which the wafer W is mounted. The load lock chamber 31 is connected to the vacuum transfer chamber 20 via the gate valve 65 and is connected to the atmosphere transfer chamber 40 via the gate valve 67. Similarly, the load lock chamber 32 includes a stage 32a on which the wafer W is mounted. The load lock chamber 32 is connected to the vacuum transfer chamber 20 via the gate valve 66 and is connected to the atmosphere transfer chamber 40 via the gate valve 68. The interiors of the load lock chambers 31 and 32 may be switched between atmospheric atmosphere and a vacuum atmosphere. The control device 70 controls the switching between the vacuum atmosphere and atmospheric atmosphere in the load lock chambers 31 and 32.

The interior of the atmosphere transfer chamber 40 is kept in atmospheric atmosphere. For example, a down-flow of a clean air is formed inside the atmosphere transfer chamber 40. A transfer mechanism 41 is provided in the atmosphere transfer chamber 40. The transfer mechanism 41 transfers the wafer W to and from the load lock chambers 31 and 32 and carriers C in the load ports 51 to 53. Operation of the transfer mechanism 41 is controlled by the control device 70.

The load ports 51 to 53 are provided on a long side wall surface of the atmosphere transfer chamber 40. A carrier C containing wafers W or an empty carrier C is attached to the load ports 51 to 53. The carrier C is, for example, a front opening unified pod (FOUP).

The gate valves 61 to 68 are configured to be openable and closable. The opening and closing of the gate valves 61 to 68 are controlled by the control device 70.

The control device 70 controls the substrate processing system 1 as a whole by performing the operations of the processing chambers 11 to 14, the operations of the transfer mechanisms 21 and 41, the opening and closing of the gate valves 61 to 68, and the switching of the vacuum atmosphere and atmospheric atmosphere in the load lock chambers 31 and 32.

Next, an example of operation of the substrate processing system will be described. For example, the control device 70 opens the gate valve 67 and controls the transfer mechanism 41 to transfer, for example, the wafer W accommodated in the carrier C of the load port 51 to the stage 31a of the load lock chamber 31. The control device 70 closes the gate valve 67 and keeps the interior of the load lock chamber 31 in a vacuum atmosphere.

The control device 70 opens the gate valves 61 and 65 and controls the transfer mechanism 21 to transfer the wafer W in the load lock chamber 31 to the stage 11a of the processing chamber 11. The control device 70 closes the gate valves 61 and 65 and operates the processing chamber 11. As a result, the wafer W is subjected to a predetermined process (e.g., the aforementioned process of the step of causing chlorine to be adsorbed) in the processing chamber 11.

Subsequently, the control device 70 opens the gate valves 61 and 63 and controls the transfer mechanism 21 to transfer the wafer W processed in the processing chamber 11 to the stage 13a of the processing chamber 13. The control device 70 closes the gate valves 61 and 63 and operates the processing chamber 13. As a result, the wafer W is subjected to a predetermined process (e.g., the aforementioned process of the step of forming a ruthenium film) in the processing chamber 13.

The control device 70 may transfer the wafer W processed in the processing chamber 11 to the stage 14a of the processing chamber 14 capable of performing the same process as in the processing chamber 13. In one embodiment, the wafer W in the processing chamber 11 is transferred to the processing chamber 13 or the processing chamber 14 depending on the operating states of the processing chamber 13 and the processing chamber 14. As a result, the control device 70 may use the processing chamber 13 and the processing chamber 14 to perform a predetermined process (e.g., the aforementioned process of the step of forming a ruthenium film) on a plurality of wafers W in parallel. This makes it possible to enhance the productivity.

The control device 70 controls the transfer mechanism 21 to transfer the wafer W processed in the processing chamber 13 or the processing chamber 14 to the stage 31a of the load lock chamber 31 or the stage 32a of the load lock chamber 32. The control device 70 keeps the interior of the load lock chamber 31 or the load lock chamber 32 in atmospheric atmosphere. The control device 70 opens the gate valve 67 or the gate valve 68 and controls the transfer mechanism 41 to transfer the wafer W in the load lock chamber 32 to, for example, the carrier C in the load port 53 and store the wafer W in the carrier C.

As described above, according to the substrate processing system 1 shown in FIG. 3, while the wafer W is processed by each processing chamber, the wafer W can be subjected to a predetermined process without exposing the wafer W to the atmosphere, i.e., without breaking the vacuum.

[Processing Apparatus]

Figure 4:
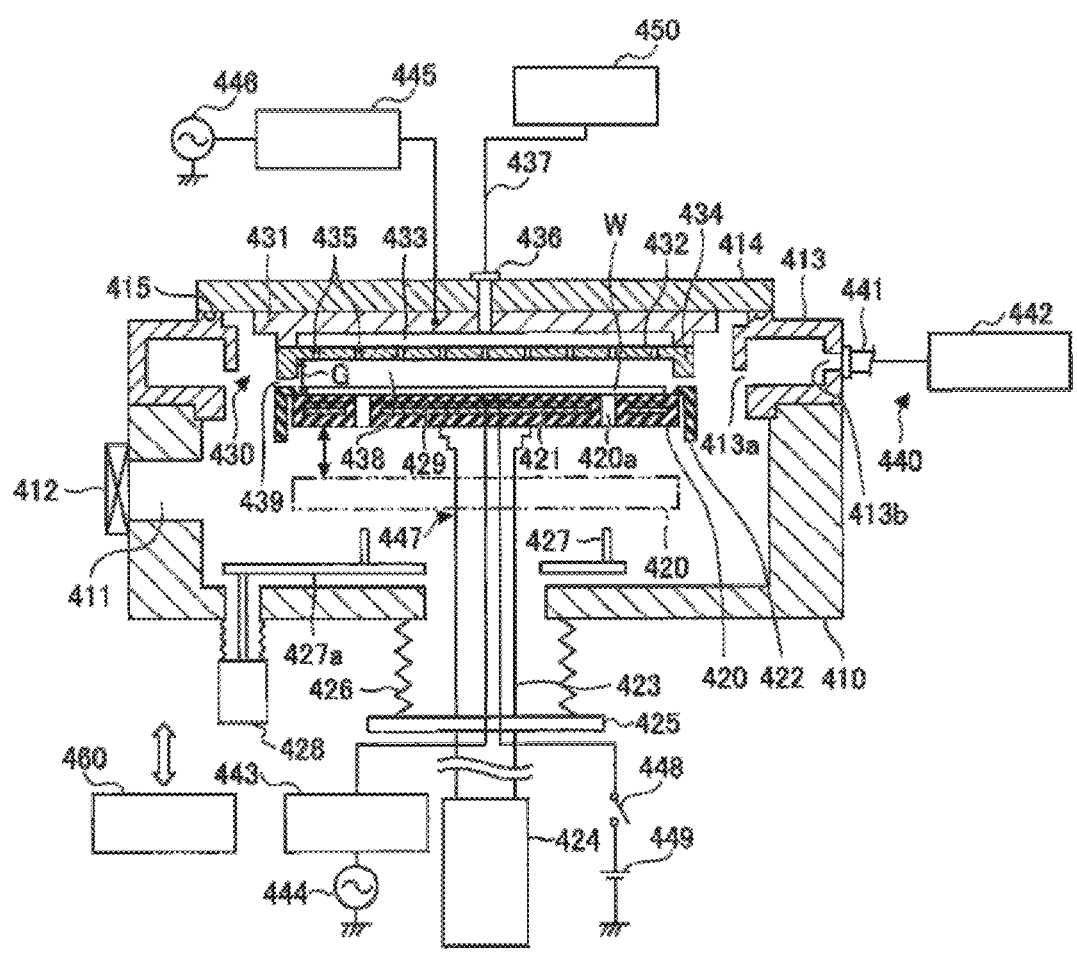
FIG. 4 is a schematic diagram showing an example of a processing apparatus that executes a process of a step of causing chlorine to be adsorbed.

A configuration example of a processing apparatus 400 that realizes the processing chamber used for the process of the step of causing the chlorine to be adsorbed in the ruthenium film forming method according to one embodiment will be described. FIG. 4 is a schematic diagram showing an example of the processing apparatus 400 that executes the process of the step of causing the chlorine to be adsorbed.

The processing apparatus 400 shown in FIG. 4 is, for example, an apparatus that performs a step of causing chlorine to be adsorbed. In the processing apparatus 400, for example, a chlorine-containing gas is supplied to perform a process of causing chlorine to be adsorbed to the wafer W. Hereinafter, the processing apparatus 400 used in the processing chamber 11 will be described by way of example.

The processing apparatus 400 includes a processing container 410, a stage 420, a shower head 430, an exhauster 440, a gas supply mechanism 450, and a control device 460.

The processing container 410 is made of metal such as aluminum or the like and has a substantially cylindrical shape.

A loading and unloading port 411 for loading and unloading the wafer W is formed on a sidewall of the processing container 410. The loading and unloading port 411 is opened or closed by a gate valve 412. An annular exhaust duct 413 having a rectangular cross section is provided on a main body of the processing container 410. A slit 413a is formed in the exhaust duct 413 along the inner circumferential surface thereof. An exhaust port 413b is formed on the outer wall of the exhaust duct 413. A ceiling wall 414 is provided on the upper surface of the exhaust duct 413 so as to close the upper opening of the processing container 410. A gap between the exhaust duct 413 and the ceiling wall 414 is hermetically sealed by a seal ring 415.

The stage 420 is a member that horizontally supports the wafer W in the processing container 410, and is illustrated as the stage 11a in FIG. 3. The stage 420 is formed in a disk shape having a size corresponding to the wafer W and is supported by a support 423. The stage 420 is made of ceramic material such as aluminum nitride (AlN) or the like, or a metallic material such as aluminum, nickel alloy, or the like. A heater 421 for heating the wafer W and an electrode 429 are embedded in the stage 420. The heater 421 is supplied with an electric power from a heater power source (not shown) to generate heat. The output of the heater 421 is controlled by a temperature signal of a thermocouple (not shown) provided near the upper surface of the stage 420, whereby the wafer W is controlled to a predetermined temperature.

A first high frequency power source 444 is connected to the electrode 429 via a matcher 443. The matcher 443 matches a load impedance with an internal impedance of the first high frequency power source 444. The first high frequency power source 444 applies an electric power of a predetermined frequency to the stage 420 via the electrode 429. For example, the first high frequency power source 444 applies high frequency power of 13.56 MHz to the stage 420 via the electrode 429. The high frequency power is not limited to 13.56 MHz. For example, high frequency power of 450 KHz, 2 MHz, 27 MHz, 60 MHz, 100 MHz, or the like may be appropriately used. In this way, the stage 420 also functions as a lower electrode.

Furthermore, the electrode 429 is connected to an adsorption power source 449 via an ON/OFF switch 448 arranged outside the processing container 410, and also functions as an electrode for attracting the wafer W toward the stage 420.

Furthermore, the shower head 430 is connected to a second high frequency power source 446 via a matcher 445. The matcher 445 matches a load impedance with an internal impedance of the second high frequency power source 446. The second high frequency power source 446 applies an electric power of a predetermined frequency to the shower head 430. For example, the second high frequency power supply 446 applies high frequency power of 13.56 MHz to the shower head 430. The high frequency power is not limited to 13.56 MHz. For example, high frequency power of 450 KHz, 2 MHz, 27 MHz, 60 MHz, 100 MHz, or the like may be appropriately used. In this way, the shower head 430 also functions as an upper electrode.

In the stage 420, a cover member 422 made of ceramics such as alumina or the like is provided so as to cover the outer peripheral region of the upper surface and the side surface of the stage 420. An adjustment mechanism 447 that adjusts a gap G between the upper electrode and the lower electrode is provided on the bottom surface of the stage 420. The adjustment mechanism 447 includes the support 423 and an elevating mechanism 424. The support 423 supports the stage 420 at the center of the bottom surface of the stage 420. In addition, the support 423 extends through a hole formed in the bottom wall of the processing container 410 and extends to below the processing container 410. The lower end of the support 423 is connected to the elevating mechanism 424. The stage 420 is moved up and down by the elevating mechanism 424 via the support 423. The adjustment mechanism 447 may move the elevating mechanism 424 up and down between a processing position indicated by a solid line in FIG. 4 and a delivery position located below the processing position as indicated by a two-dot chain line so that the wafer W can be transferred. This makes it possible to load and unload the wafer W.

A flange 425 is attached to the support 423 below the processing container 410. A bellows 426 that separates the atmosphere in the processing container 410 from the ambient air and expands and contracts as the stage 420 moves up and down is provided between the bottom surface of the processing container 410 and the flange 425.

In the vicinity of the bottom surface of the processing container 410, three lift pins 427 (only two of which are shown) are provided so as to protrude upward from a lift plate 427a. The lift pins 427 are raised and lowered via the lift plate 427a by a lift mechanism 428 provided below the processing container 410.

The lift pins 427 are inserted into through-holes 420a provided in the stage 420 located at the delivery position and can protrude or retract with respect to the upper surface of the stage 420. By raising and lowering the lift pins 427, the wafer W is delivered between the transfer mechanism (not shown) and the stage 420.

The shower head 430 supplies a process gas into the processing container 410 in a shower shape. The shower head 430 is made of metal and is provided so as to face the stage 420. The shower head 430 has a diameter substantially equal to that of the stage 420. The shower head 430 includes a main body 431 fixed to the ceiling wall 414 of the processing container 410, and a shower plate 432 connected to the underside of the main body 431. A gas diffusion space 433 is formed between the main body 431 and the shower plate 432, and a gas introduction hole 436 loading to the gas diffusion space 433 is provided so as to pass through the ceiling wall 414 of the processing container 410 and the center of the main body 431. An annular protrusion 434 that protrudes downward is formed at the peripheral edge portion of the shower plate 432. Gas discharge holes 435 are formed on the inner flat surface of the annular protrusion 434. When the stage 420 is in the processing position, a processing space 438 is formed between the stage 420 and the shower plate 432, and the upper surface of the cover member 422 comes close to the annular protrusion 434 to form an annular gap 439.

The exhauster 440 evacuates the interior of the processing container 410. The exhauster 440 includes an exhaust pipe 441 connected to the exhaust port 413b, and an exhaust mechanism 442 connected to the exhaust pipe 441 and provided with a vacuum pump, a pressure control valve, and the like. At the time of processing, the gas in the processing container 410 is moved to the exhaust duct 413 through the slit 413a and is exhausted from the exhaust duct 413 through the exhaust pipe 441 by the exhaust mechanism 442.

The gas supply mechanism 450 is connected to the gas introduction hole 436 of the shower head 430 via a gas supply line 437. The gas supply mechanism 450 is connected to gas supply sources of various gases used in the process of the step of causing the chlorine to be adsorbed, through gas supply lines, respectively. For example, the gas supply mechanism 450 is connected to gas supply sources for supplying various gases such as a $Cl_2$ gas, an $H_2$ gas, a rare gas, and the like, via gas supply lines, respectively.

Each gas supply line is appropriately branched according to the process of the step of causing the chlorine to be adsorbed. An opening and closing valve and a flow rate controller are provided on each gas supply line. The gas supply mechanism 450 is capable of controlling the flow rates of various gases by controlling the opening and closing valve and the flow rate controller provided in each gas supply line. The gas supply mechanism 450 supplies each of various gases including a $Cl_2$ gas into the processing container 410 via the gas supply line 437 and the shower head 430 during the process of the step of causing the chlorine to be adsorbed.

Operation of the processing apparatus 400 configured as described above is generally controlled by the control device 460. The control device 460 is, for example, a computer, and includes a central processing unit (CPU), a random access memory (RAM), a read only memory (ROM), an auxiliary memory device, and the like. The CPU operates based on a program stored in the ROM or the auxiliary memory device or a process condition of the process of the step of causing the chlorine to be adsorbed, and controls the operation of the apparatus as a whole. For example, the control device 460 controls the supply operation of various gases from the gas supply mechanism 450, the elevating operation of the elevating mechanism 424, the evacuating operation of the interior of the processing container 410 by the exhaust mechanism 442, and the electric powers supplied from the first high frequency power source 444 and the second high frequency power source 446. The computer-readable program necessary for control may be stored in a storage medium. The storage medium is, for example, a flexible disk, a compact disc (CD), a CD-ROM, a hard disk, a flash memory, a DVD, or the like. The control device 460 may be provided independently of the control device 70 (see FIG. 3), or the control device 70 may also serve as the control device 460.

An example of the operation of the processing apparatus 400 will be described. At the time of startup, the interior of the processing chamber 11 is kept in a vacuum atmosphere by the exhauster 440. In addition, the stage 420 is moved to the delivery position.

The control device 460 opens the gate valve 412. At this time, the wafer W is placed on the lift pins 427 by the external transfer mechanism 21. When the transfer mechanism 21 comes out of the loading and unloading port 411, the control device 460 closes the gate valve 412.

The control device 460 controls the elevating mechanism 424 to move the stage 420 to the processing position. At this time, as the stage 420 moves up, the wafer W placed on the lift pins 427 is mounted on the mounting surface of the stage 420.

At the processing position, the control device 460 operates the heater 421 and turns on the ON/OFF switch 448 to attract the wafer W to the stage 420. Furthermore, the control device 460 controls the gas supply mechanism 450 to supply a process gas such as a chlorine-containing gas or the like, or a carrier gas, into the processing chamber 11 from the shower head 430. As a result, a predetermined process such as the process of the step of causing the chlorine to be adsorbed to the wafer W is performed. The gas remaining after the process passes through a flow path on the upper surface side of the cover member 422 and is exhausted by the exhaust mechanism 442 via the exhaust pipe 441.

At this time, the control device 460 controls the first high frequency power source 444 and the matcher 443 to apply an electric power of a predetermined frequency to the stage 420. Furthermore, the control device 460 controls the second high frequency power source 446 and the matcher 445 to apply an electric power of a predetermined frequency to the shower head 430.

When the predetermined process is completed, the control device 460 turns off the ON/OFF switch 448 to release the attraction of the wafer W to the stage 420, and controls the elevating mechanism 424 to move the stage 420 to the delivery position. At this time, head portions of the lift pins 427 protrude from the mounting surface of the stage 420 to lift the wafer W from the mounting surface of the stage 420.

The control device 460 opens the gate valve 412. At this time, the wafer W placed on the lift pins 427 is unloaded by the external transfer mechanism 21. When the transfer mechanism 21 comes out of the loading and unloading port 411, the control device 460 closes the gate valve 412.

As described above, according to the processing apparatus 400 shown in FIG. 4, it is possible to perform a predetermined process such as the process of the step of causing the chlorine to be adsorbed to the wafer W.

A suitable process condition of the step of causing the chlorine to be adsorbed, which is performed using the processing apparatus 400, is as follows.

Figure 5:
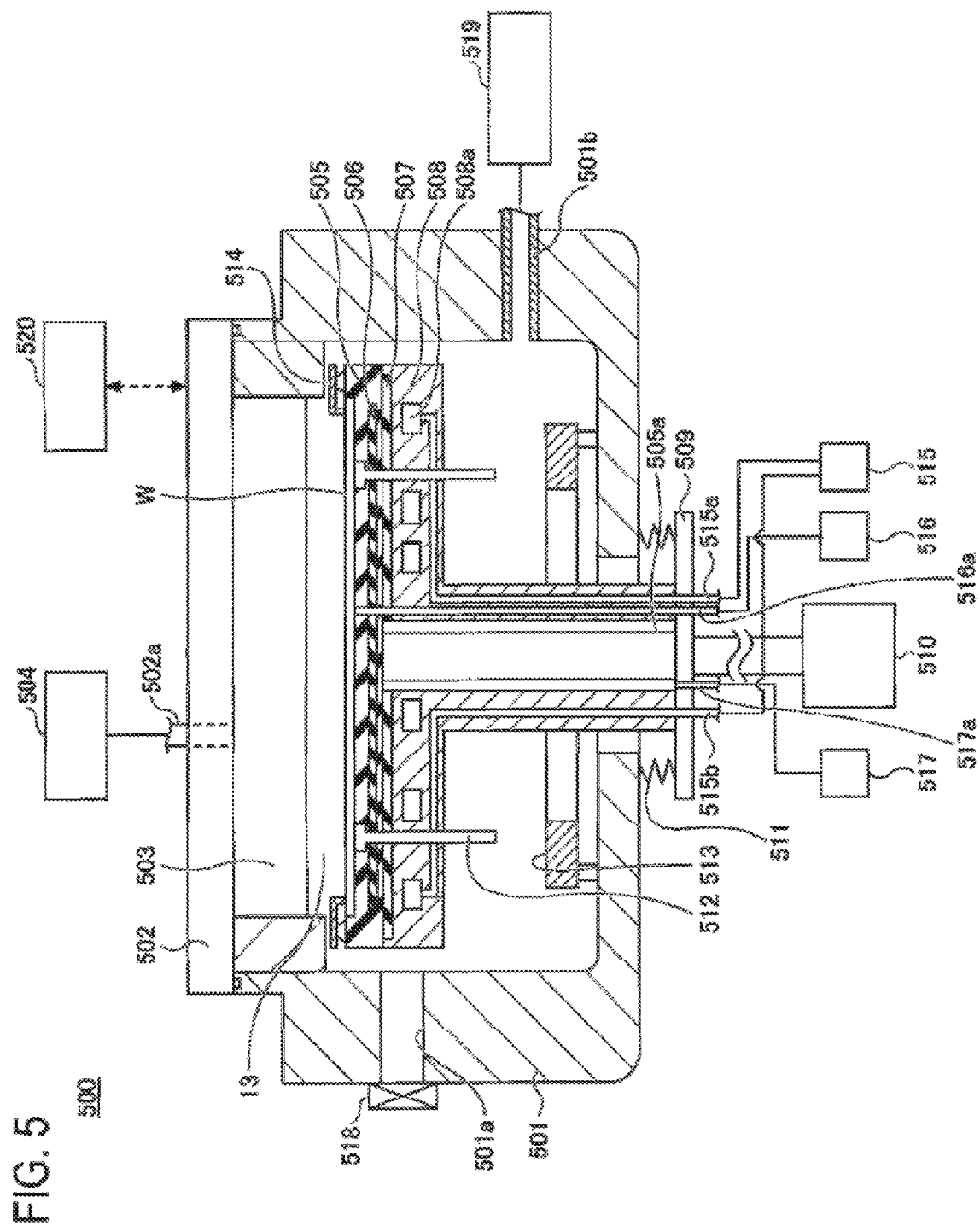
FIG. 5 is a schematic diagram showing an example of a processing apparatus that executes a process of a step of forming a ruthenium film.

Chlorine-containing gas: $Cl_2$ gas (10 to 1000 sccm)
Pressure in the processing container 410: 1 to 100 mTorr (0.13 to 13 Pa)
Wafer temperature: 60 to 300 degrees C.
Electric power of the second high frequency power source 446: 50 to 500 W Next, a configuration example of a processing apparatus 500 that realizes the processing chamber used in the process of the step of forming the ruthenium film in the ruthenium film forming method according to one embodiment will be described. FIG. 5 is a schematic diagram showing an example of the processing apparatus 500 that performs the process of the step of forming the ruthenium film.

The processing apparatus 500 shown in FIG. 5 is a chemical vapor deposition (CVD) apparatus and is, for example, an apparatus for performing the step of forming the ruthenium film. In the processing apparatus 500, for example, a ruthenium-containing precursor is supplied to perform the step of forming the ruthenium film on the wafer W. Hereinafter, the processing apparatus 500 used in the processing chamber 13 will be described by way of example.

A main body container 501 is a bottom-closed container having an opening on the upper side thereof. A support 502 supports a gas discharge mechanism 503. Furthermore, the support 502 closes the upper opening of the main body container 501 so that the main body container 501 is hermetically sealed to form the processing chamber 13 (also see FIG. 3). A gas supplier 504 supplies a process gas such as a ruthenium-containing gas or the like, or a carrier gas, to the gas discharge mechanism 503 via a supply pipe 502a penetrating the support 502. The ruthenium-containing gas or the carrier gas supplied from the gas supplier 504 is supplied from the gas discharge mechanism 503 into the processing chamber 13.

A stage 505 is a member on which the wafer W is mounted, and is illustrated as the stage 13a in FIG. 3. Inside the stage 505, a heater 506 for heating the wafer W is provided. Furthermore, the stage 505 includes a support 505a which extends downward from the center of the lower surface of the stage 505 and which has one end penetrating the bottom portion of the main body container 501 and supported by an elevating mechanism via an elevating plate 509. Furthermore, the stage 505 is fixed on a temperature control jacket 508, which is a temperature control member, via a heat insulating ring 507. The temperature control jacket 508 includes a plate portion for fixing the stage 505, a shaft portion extending downward from the plate portion and configured to cover the support 505a, and a hole portion extending through the shaft portion from the plate portion.

The shaft portion of the temperature control jacket 508 penetrates the bottom portion of the main body container 501. The lower end portion of the temperature control jacket 508 is supported by an elevating mechanism 510 via the elevating plate 509 arranged below the main body container 501. A bellows 511 is provided between the bottom portion of the main body container 501 and the elevating plate 509. The airtightness inside the main body container 501 is maintained even when the elevating plate 509 moves up and down.

When the elevating mechanism 510 raises and lowers the elevating plate 509, the stage 505 moves up and down between a processing position (see FIG. 5) where the wafer W is processed and a delivery position (not shown) where the wafer W is delivered to and from the external transfer mechanism 21 (see FIG. 3) via a loading and unloading port 501a.

Lift pins 512 support the lower surface of the wafer W and lift the wafer W from the mounting surface of the stage 505 when the wafer W is delivered to and from the external transfer mechanism 21 (see FIG. 3). Each of the lift pins 512 includes a shaft portion and a head portion having a diameter larger than that of the shaft portion. Through-holes through which the shaft portions of the lift pins 512 are inserted are formed in the stage 505 and the plate portion of the temperature control jacket 508. In addition, groove portions for accommodating the head portions of the lift pins 512 are formed on the mounting surface side of the stage 505. A contact member 513 is arranged below the lift pins 512.

In a state in which the stage 505 moved to the processing position for the wafer W (see FIG. 5), the head portions of the lift pins 512 are accommodated in the groove portions, and the wafer W is mounted on the mounting surface of the stage 505. Furthermore, the head portions of the lift pins 512 are locked in the groove portions, the shaft portions of the lift pins 512 penetrate the stage 505 and the plate portion of the temperature control jacket 508, and the lower ends of the shaft portions of the lift pins 512 protrude from the plate portion of the temperature control jacket 508. On the other hand, in a state where the stage 505 is moved to the delivery position (not shown) for the wafer W, the lower ends of the lift pins 512 make contact with the contact member 513, and the head portions of the lift pins 512 protrude from the mounting surface of the stage 505. As a result, the head portions of the lift pins 512 support the lower surface of the wafer W and lift the wafer W from the mounting surface of the stage 505.

An annular member 514 is arranged above the stage 505. In a state in which the stage 505 is moved to the processing position for the wafer W (see FIG. 5), the annular member 514 makes contact with the outer peripheral portion of the upper surface of the wafer W, and the weight of the annular member 514 causes the wafer W to be pressed against the mounting surface of the stage 505. On the other hand, in a state in which the stage 505 is moved to the delivery position (not shown) for the wafer W, the annular member 514 is locked by a locking part (not shown) at a position above the loading and unloading port 501a. As a result, the delivery of the wafer W by the transfer mechanism 21 (see FIG. 3) is not hindered.

A chiller unit 515 circulates a coolant, for example, cooling water, through a flow path 508a formed in the plate portion of the temperature control jacket 508 via pipes 515a and 515b.

A heat transfer gas supplier 516 supplies a heat transfer gas such as an He gas or the like to between the back surface of the wafer W mounted on the stage 505 and the mounting surface of the stage 505 via a pipe 516a.

A purge gas supplier 517 supplies a purge gas to a pipe 517a, a gap between the support 505a and the hole portion of the temperature control jacket 508, a flow path formed between the stage 505 and the heat insulating ring 507 to extend radially outward, and a vertical flow path formed in the outer peripheral portion of the stage 505. The purge gas such as, for example, a carbon monoxide (CO) gas or the like is supplied to between the lower surface of the annular member 514 and the upper surface of the stage 505 through these flow paths. This prevents the process gas from flowing into a space between the lower surface of the annular member 514 and the upper surface of the stage 505, thereby preventing film formation on the lower surface of the annular member 514 or on the upper surface of the outer peripheral portion of the stage 505.

On the side wall of the main body container 501, the loading and unloading port 501a for loading and unloading the wafer W and a gate valve 518 for opening and closing the loading and unloading port 501a are provided. The gate valve 518 is shown as the gate valve 63 in FIG. 3.

An exhauster 519 including a vacuum pump and the like is connected to the lower side wall of the main body container 501 via an exhaust pipe 501b. The interior of the main body container 501 is evacuated by the exhauster 519, and the interior of the processing chamber 13 is set to and maintained in a predetermined vacuum atmosphere (e.g., 1.33 Pa).

A control device 520 controls the gas supplier 504, the heater 506, the elevating mechanism 510, the chiller unit 515, the heat transfer gas supplier 516, the purge gas supplier 517, the gate valve 518, the exhauster 519, and the like, thereby controlling the operation of the processing apparatus 500. The control device 520 may be provided independently of the control device 70 (see FIG. 3). The control device 70 may also serve as the control device 520.

An example of operation of the processing apparatus 500 will be described. At the time of startup, the interior of the processing chamber 13 is kept in a vacuum atmosphere by the exhauster 519. The stage 505 is moved to the delivery position.

The control device 520 opens the gate valve 518. At this time, the wafer W is placed on the lift pins 512 by the external transfer mechanism 21. When the transfer mechanism 21 comes out of the loading and unloading port 501a, the control device 520 closes the gate valve 518.

The control device 520 controls the elevating mechanism 510 to move the stage 505 to the processing position. At this time, as the stage 505 moves up, the wafer W placed on the lift pins 512 is mounted on the mounting surface of the stage 505. Furthermore, the annular member 514 makes contact with the outer peripheral portion of the upper surface of the wafer W. and the weight of the annular member 514 causes the wafer W to be pressed against the mounting surface of the stage 505.

At the processing position, the control device 520 operates the heater 506 and controls the gas supplier 504 to supply a process gas such as a ruthenium-containing gas or the like, or a carrier gas, from the gas discharge mechanism 503 into the processing chamber 12. As a result, a predetermined process such as the process of the step of forming the ruthenium film on the wafer W is performed. The gas remaining after the process passes through a flow path on the upper surface side of the annular member 514 and is exhausted by the exhauster 519 via the exhaust pipe 501b.

At this time, the control device 520 controls the heat transfer gas supplier 516 to supply a heat transfer gas between the back surface of the wafer W mounted on the stage 505 and the mounting surface of the stage 505. Furthermore, the control device 520 controls the purge gas supplier 517 to supply a purge gas to between the lower surface of the annular member 514 and the upper surface of the stage 505. The purge gas passes through a flow path on the lower surface side of the annular member 514 and is exhausted by the exhauster 519 via the exhaust pipe 501b.

When the predetermined process is completed, the control device 520 controls the elevating mechanism 510 to move the stage 505 to the delivery position. At this time, as the stage 505 moves down, the annular member 514 is locked by the locking portion (not shown). Furthermore, when the lower ends of the lift pins 512 makes contact with the contact member 513, the head portions of the lift pins 512 protrude from the mounting surface of the stage 505 and lift the wafer W from the mounting surface of the stage 505.

The control device 520 opens the gate valve 518. At this time, the wafer W placed on the lift pins 512 is unloaded by the external transfer mechanism 21. When the transfer mechanism 21 comes out of the loading and unloading port 501a, the control device 520 closes the gate valve 518.

As described above, according to the processing apparatus 500 shown in FIG. 5, it is possible to perform a predetermined process such as the process of the step of forming the ruthenium film on the wafer W.

Although the processing apparatus 400 having the processing chamber 11 and the processing apparatus 500 having the processing chamber 13 have been described above, a processing apparatus having the processing chamber 12 and a processing apparatus having the processing chamber 14 may have the same configuration as that of any one of the above-described processing apparatuses, or may have a different configuration from that of any one of the above-described processing apparatuses. The configuration of the processing apparatus is appropriately applicable from the viewpoint of the operating rate or the productivity.

Example

Next, an example conducted to verify the adsorption inhibition effect of chlorine against the Ru-containing precursor will be described.

In the example, first, two wafers were prepared in which a TiN film 602 and a tungsten film 603 are stacked in the named order on a silicon base 601.

Subsequently, one of the prepared wafers was subjected to a process of a step of causing chlorine to be adsorbed in the processing chamber 11, and then subjected to a process of a step of forming a ruthenium film 604 in the processing chamber 13. Furthermore, the other of the prepared wafers was subjected to a process of a step of forming a ruthenium film 604 in the processing chamber 13 without being subjected to a process of a step of causing chlorine to be adsorbed in the processing chamber 11. The process conditions of the process of the step of forming the ruthenium film 604, which is performed in the processing chamber 13 on the one wafer and the other wafer, are the same. The process conditions of the step of causing the chlorine to be adsorbed and the step of forming the ruthenium film 604 are as follows.

(Step of Causing the Chlorine to be Adsorbed)
  Chlorine-containing gas: $Cl_2$ gas (240 sccm)
  Processing pressure: 30 mTorr (4 Pa)
  Wafer temperature: 60 degrees C.
(Step of Forming the Ruthenium Film 604)
  Processing pressure: 20 mTorr (2.7 Pa)
  Wafer temperature: 155 degrees C.

Then, the film thickness of the ruthenium film 604 formed on the tungsten film 603 was evaluated by observing the cross sections of the two wafers using a transmission electron microscope (TEM).

Figure 6A:
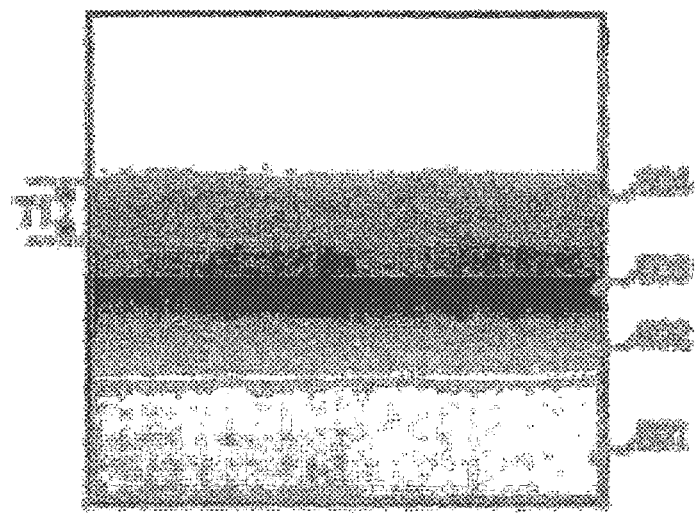
FIGS. 6A and 6B are views for explaining an adsorption inhibition effect of chlorine.
Figure 6B:
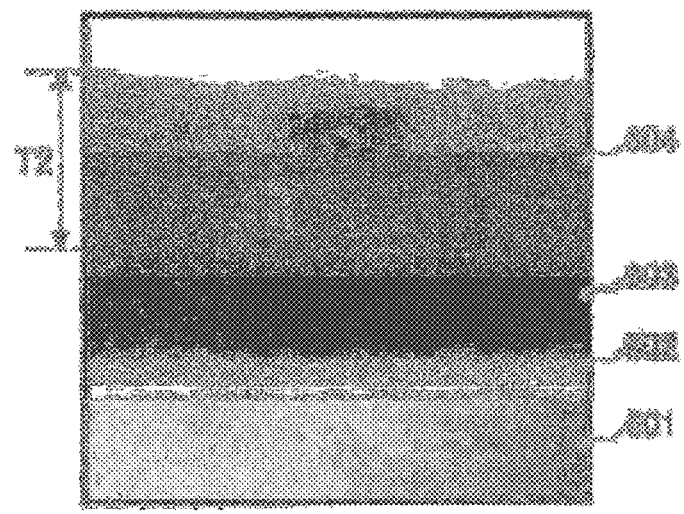

FIGS. 6A and 6B are views for explaining an adsorption inhibition effect of chlorine and are TEM images of the cross section of the ruthenium film 604 formed on the tungsten film 603. FIG. 6A shows the cross section of the wafer that has been subjected to the process of the step of causing the chlorine to be adsorbed in the processing chamber 11 and then subjected to the process of the step of forming the ruthenium film 604 in the processing chamber 13. FIG. 6B shows the cross section of the wafer that has been subjected to the process of the step of forming the ruthenium film 604 in the processing chamber 13 without being subjected to the process of the step of causing the chlorine to be adsorbed in the processing chamber 11.

As shown in FIGS. 6A and 6B, it can be noted that a film thickness T1 of the ruthenium film 604 (see FIG. 6A) when the process of the step of causing the chlorine to be adsorbed was performed in the processing chamber 11 is equal to or less than one half of a film thickness T2 of the ruthenium film 604 (see FIG. 6B) when the process of the step of causing the chlorine to be adsorbed was not performed in the processing chamber 11. From this result, it can be said that the chlorine adsorbed to the tungsten film 603 has an action of inhibiting the adsorption of the Ru-containing precursor.

In the above embodiment, there has been described the case where the step of causing the chlorine to be adsorbed and the step of forming the ruthenium film are performed in different processing containers connected via the vacuum transfer chamber. However, the present disclosure is not limited thereto. For example, the step of causing the chlorine to be adsorbed and the step of forming the ruthenium film may be performed in the same processing container. However, when the processing temperature differs between the step of causing the chlorine to be adsorbed and the step of forming the ruthenium film, it is preferable from the viewpoint of productivity that the step of causing the chlorine to be adsorbed and the step of forming the ruthenium film are performed in different processing containers.

According to the present disclosure in some embodiments, it is possible to form a ruthenium film with good embedding characteristics.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A ruthenium film forming method in a substrate processing system, comprising:
  a plurality of processing containers connected to a vacuum transfer chamber;
  a controller configured to perform steps of;
  forming an inhibition layer in a recess by supplying a chlorine-containing gas to a substrate including an insulating film and having the recess in a depressurized state; and
  forming a ruthenium film in the recess by supplying a Ru-containing precursor to the recess in which the inhibition layer is formed in the depressurized state,
  wherein the forming the inhibition layer includes adsorbing chlorine to a top surface and an upper portion of a side surface of the recess without adsorbing chlorine to a bottom surface and a lower portion of the side surface of the recess, so that in the forming the ruthenium film, the chlorine adsorbed to the recess inhibits adsorption of the Ru-containing precursor to the recess, and
  wherein the forming the inhibition layer and the forming the ruthenium film are alternately and repeatedly executed to perform bottom-up formation in which film formation gradually progresses upward from the bottom surface of the recess.

2. The method of claim 1, wherein the forming the inhibition layer includes supplying the chlorine-containing gas by activating the chlorine-containing gas with plasma.

3. The method of claim 1, further comprising:
  removing an oxide film formed on the bottom surface of the recess by supplying the chlorine-containing gas to the recess before the forming the inhibition layer.

4. The method of claim 3, wherein the forming the inhibition layer and the forming the ruthenium film are performed in different processing containers of the plurality of the processing containers connected via the vacuum transfer chamber.

5. The method of claim 4, wherein the chlorine-containing gas is a $Cl_2$ gas, and the Ru-containing precursor is $Ru_3(CO)_{12}$.

6. The method of claim 1, wherein the forming the inhibition layer and the forming the ruthenium film are performed in different processing containers of the plurality of the processing containers connected via the vacuum transfer chamber.

7. The method of claim 1, wherein the forming the inhibition layer and the forming the ruthenium film are performed in a same processing container of the plurality of the processing containers.

8. The method of claim 1, wherein the chlorine-containing gas is a $Cl_2$ gas, and the Ru-containing precursor is $Ru_3(CO)_{12}$.

* * * * *